(12) United States Patent
Cs et al.

(10) Patent No.: US 9,164,135 B2
(45) Date of Patent: Oct. 20, 2015

(54) SYSTEM AND METHOD FOR MEASURING PHASE ATTRIBUTES OF ELECTRICAL GRID SYSTEM AND EQUIPMENT USING A SMART PROBE

(75) Inventors: Adishesha Cs, Karnataka (IN); Arun Vijayakumari Mahasenan, Kerala (IN); Bhanumurthy Veeragandham, Karnataka (IN)

(73) Assignee: Honeywell International Inc., Morristown, NJ (US)

( * ) Notice: Subject to any disclaimer, the term of this patent is extended or adjusted under 35 U.S.C. 154(b) by 1072 days.

(21) Appl. No.: 13/230,901

(22) Filed: Sep. 13, 2011

(65) Prior Publication Data

US 2013/0066576 A1    Mar. 14, 2013

(51) Int. Cl.
*G01R 13/02* (2006.01)
*G01R 25/08* (2006.01)
*G01R 15/14* (2006.01)

(52) U.S. Cl.
CPC .............. *G01R 25/08* (2013.01); *G01R 15/142* (2013.01)

(58) Field of Classification Search
USPC ........................ 702/64, 65, 67, 72; 324/66, 86
See application file for complete search history.

(56) References Cited

U.S. PATENT DOCUMENTS

| | | | |
|---|---|---|---|
| 3,392,334 A | 7/1968 | Bevins | |
| 5,510,700 A * | 4/1996 | Pomatto | 324/66 |
| 5,521,491 A * | 5/1996 | Najam | 324/86 |
| 6,275,022 B1 | 8/2001 | Bierer | |
| 6,459,252 B1 | 10/2002 | Bierer | |
| 6,667,610 B2 | 12/2003 | Piesinger | |
| 6,734,658 B1 | 5/2004 | Bierer | |
| 7,031,859 B2 | 4/2006 | Piesinger | |
| 7,109,699 B1 | 9/2006 | Bierer | |
| 2002/0135353 A1 | 9/2002 | Bierer | |

\* cited by examiner

*Primary Examiner* — Mohamed Charioui
(74) *Attorney, Agent, or Firm* — Wood, Phillips, Katz, Clark & Mortimer

(57) ABSTRACT

A system for measuring phase attributes of high voltage electrical lines comprises a single high voltage probe. The probe comprises a sensing element for selectively measuring voltage of a high voltage electrical line. A processing circuit detects zero crossings of the measured voltage, applies a time tag to the zero crossings, and stores samples of the amplitude and time tagged zero crossings. A memory stores samples of the amplitude and time tagged zero crossings for a plurality of high voltage electrical lines. A processor is operatively associated with the memory for determining phase relationships between the plurality of high voltage electrical lines.

18 Claims, 4 Drawing Sheets

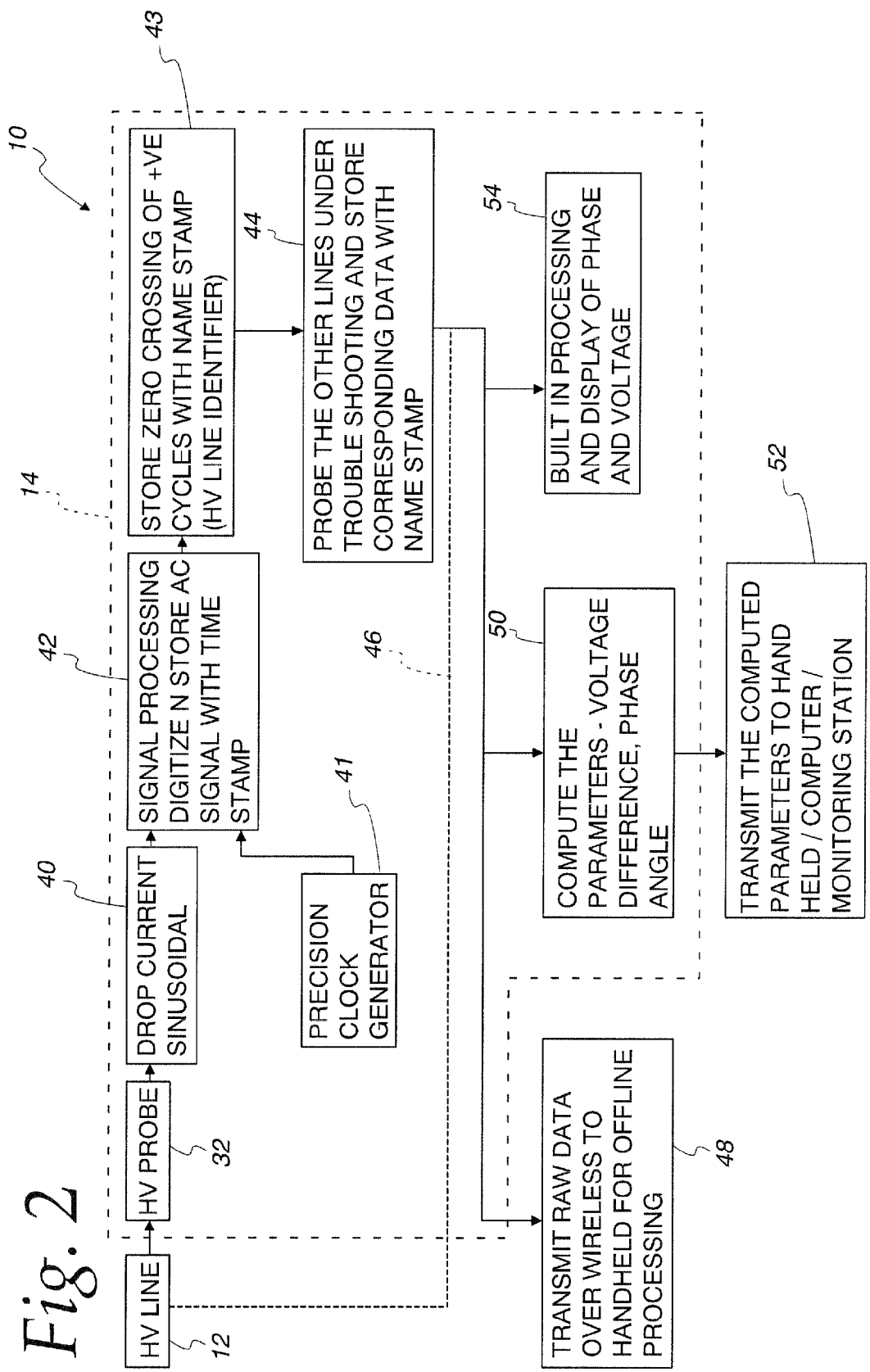

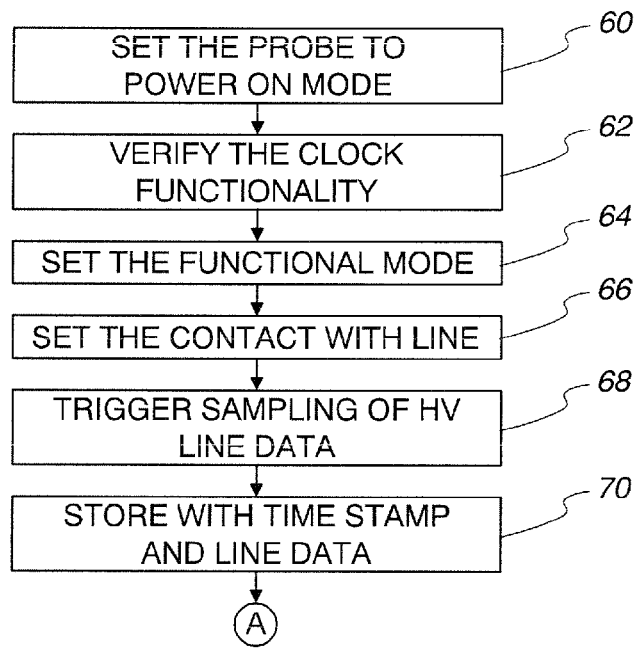
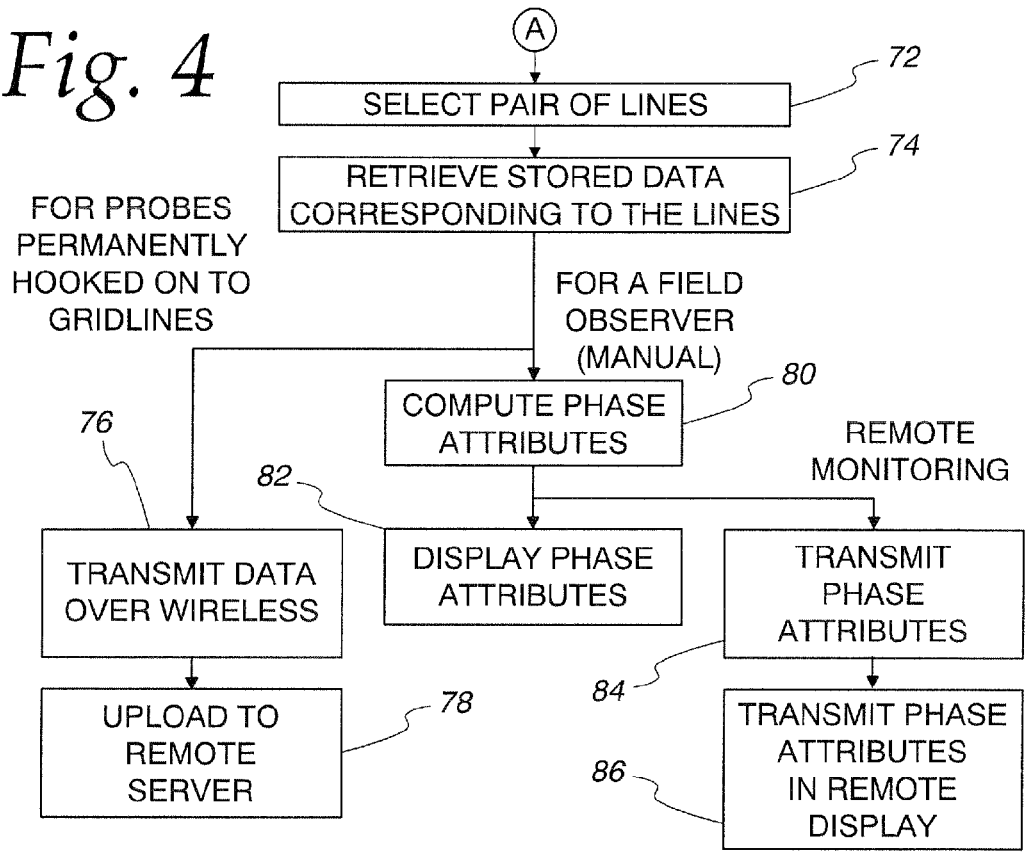

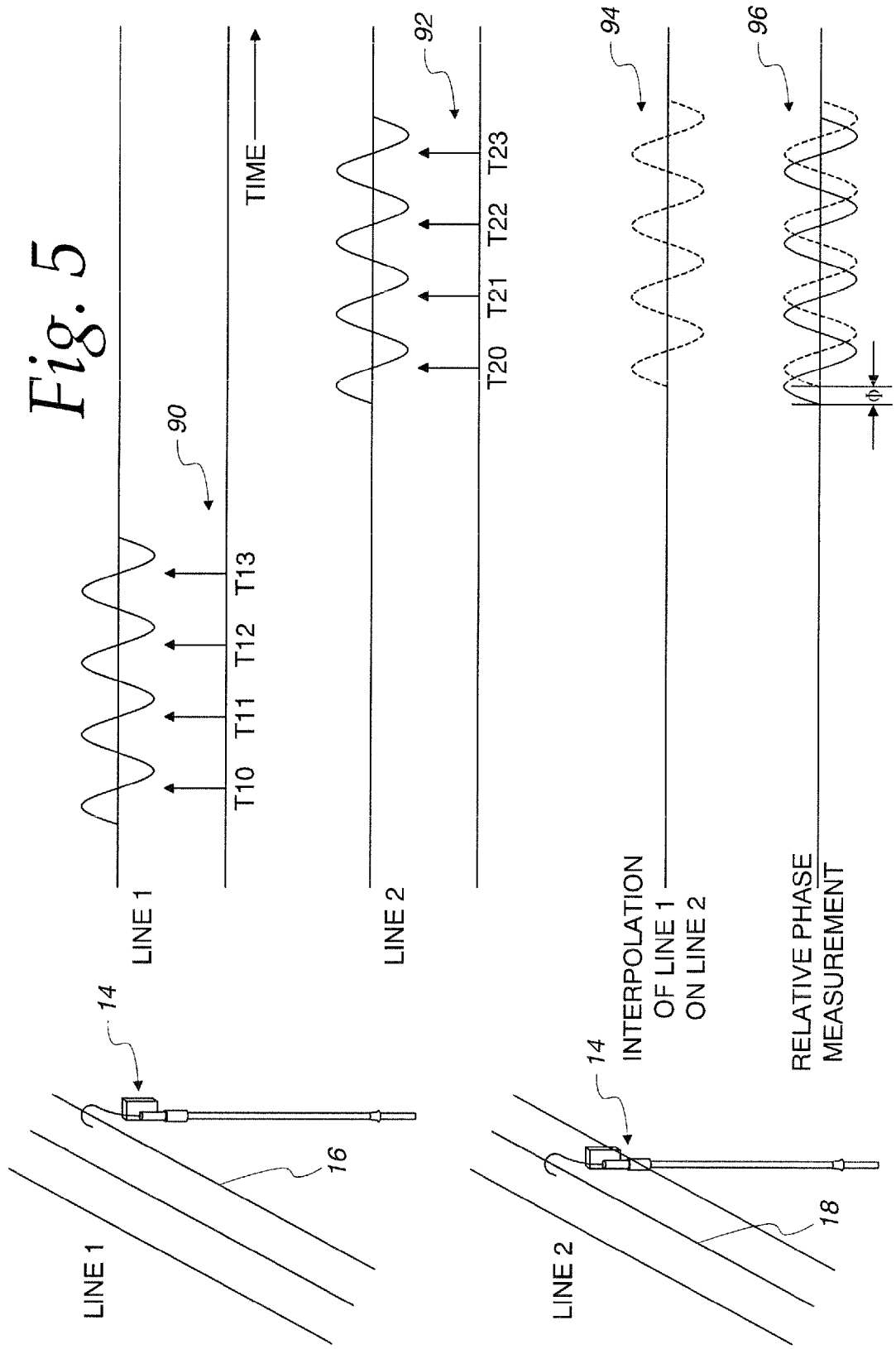

SYSTEM AND METHOD FOR MEASURING PHASE ATTRIBUTES OF ELECTRICAL GRID SYSTEM AND EQUIPMENT USING A SMART PROBE

CROSS-REFERENCE TO RELATED APPLICATIONS

Not Applicable.

FEDERALLY SPONSORED RESEARCH OR DEVELOPMENT

Not Applicable.

MICROFICHE/COPYRIGHT REFERENCE

Not Applicable.

FIELD

The present invention relates to a system using a single smart probe to measure phase attributes of utility transmission lines and the like.

BACKGROUND

Electrical power distribution systems often include overhead electrical power distribution lines mounted upon poles by a wide variety of mounting structure. Other distribution systems include underground distribution lines in which protected cables run under the ground surface. High voltage phasing meters are designed for use as safety tools by maintenance line workers to verify the status voltage and phase of the grid lines, phase angle between the lines and also phase sequencing. Even though feeder circuits in utility lines are intended to be well balanced in the initial deployment, one of the phases may turn out to be more heavily loaded than others. This leads to load imbalances.

Conventional high voltage phasing meters comprise high resistance reference and meter probes connected in series with a calibrated panel meter to read the voltage across the phase-to-phase or phase-to-ground terminals. They are designed for use as safety tools by high voltage line maintenance workers to verify the status of the line or equipment as nominal, induced or de-energized. Known devices for providing such measurements include contact type and non-contact cordless type. With contact type a reference probe or transmitter and a meter probe or receiver are connected in series with a cable as the loop is closed with load terminals. With the non-contact type each probe has a meter and the probes close the circuit through wireless means.

Presently, a variety of other phasing meters are being used. These include wireless phasing meters, GPS phasing tools and remote phase ID systems. A wireless phasing meter comprises a reference probe and a meter probe. Phase indication and readings are displayed in the meter housing. The operator has to use both of the probes on the lines and read the display while connected to the lines. There is no data storage facility and the display must be read instantaneously. Further, only trained personnel could interpret the phase sequence.

A GPS phasing tool consists of a meter probe, a field unit and a base unit. The base unit is installed at a remote location, such as a substation. The field unit consists of the meter probe with a signal processing system to compute the phase attributes of the power lines corresponding to the reference phase. This tool depends on the GPS base reference in the base station and uses a GPS receiver as a dedicated reference. The system depends on GSM/GPRS for phase sequencing. There is no facility for remote monitoring of phase sequence data.

A phase ID system has a field unit and a base unit. The field unit has a high voltage probe with a GPS receiver and a stable clock generator and wireless transceiver. A base unit consists of a GPS receiver and a send unit connected to a server. GPS timing systems are used to obtain snapshot phase measurements at an unknown field location and at a known reference location at the same instant of time. These two measurements are compared at the base station to determine the phase attribute at the unknown field location.

The disclosed system and method provides improvements over the known solutions discussed above.

SUMMARY

The disclosed system and method measures phase attributes of an electrical grid system and equipment using a smart probe.

There is disclosed herein a system for measuring phase attributes of high voltage electrical lines comprising a single high voltage probe. The probe comprises a sensing element for selectively measuring current or voltage of a high voltage electrical line and developing a measured signal. A processing circuit detects zero crossings of the measured signal, applies a time tag to the zero crossings, and stores samples of the measured signal and time tagged zero crossings. A memory stores samples of the measured signal and time tagged zero crossings for a plurality of high voltage electrical lines. A processor is operatively associated with the memory for determining phase relationships between the plurality of high voltage electrical lines.

It is a feature of the invention that the probe comprises a housing and the processing circuit, the memory and the processor are enclosed in the housing. The probe may further comprise a display for displaying the phase relationships. A remote device may wirelessly communicate with the probe and the remote device may comprise a display for displaying the phase relationships.

It is another feature of the invention that a remote device wirelessly communicates with the single probe and includes the memory and the processor. The remote device may further comprise a display for displaying the phase relationships.

There is also disclosed a system for measuring phase attributes of high voltage electric lines comprising a smart probe comprising a housing supporting a sensing element. A probe circuit is in the housing and is coupled to the sensing element for selectively measuring current or voltage of a high voltage electrical line and developing a measured signal. The probe circuit comprises a reference time clock, a processing circuit for detecting zero crossings of the measured signal and applying a time tag from the time clock to the zero crossings, and a first memory for storing samples of the measured signal and time tagged zero crossings. A second memory is operatively associated with the first memory for storing samples of the measured signal and time tagged zero crossings for a plurality of high voltage electrical lines. A processor is operatively associated with the second memory for determining phase relationships between the plurality of high voltage electrical lines.

There is also disclosed a method for measuring phase attributes of high voltage electrical lines comprising providing a single high voltage probe comprising a sensing element for selectively measuring current or voltage of a high voltage electrical line and developing a measured signal, and a processing circuit for detecting zero crossings of the measured signal, applying a time tagged to the zero crossings, and storing samples of the measured signal and time tagged zero crossings; operating the probe to sequentially store samples of the measured signal and time tagged zero crossings for a plurality of high voltage electrical lines; and determining phase relationships between the plurality of high voltage electrical lines using the sequentially stored samples.

Other features and advantages will be apparent from a review of the entire specification, including the appended claims and drawings.

BRIEF DESCRIPTION OF THE DRAWINGS

FIG. 2 is a block diagram of the system of claim 1;

FIGS. 3 and 4 are a flow diagram illustrating a method implemented by the system of FIG. 1; and FIG. 5 is a timing diagram illustrating operation of the system of FIG. 1.

DETAILED DESCRIPTION

Figure 1:
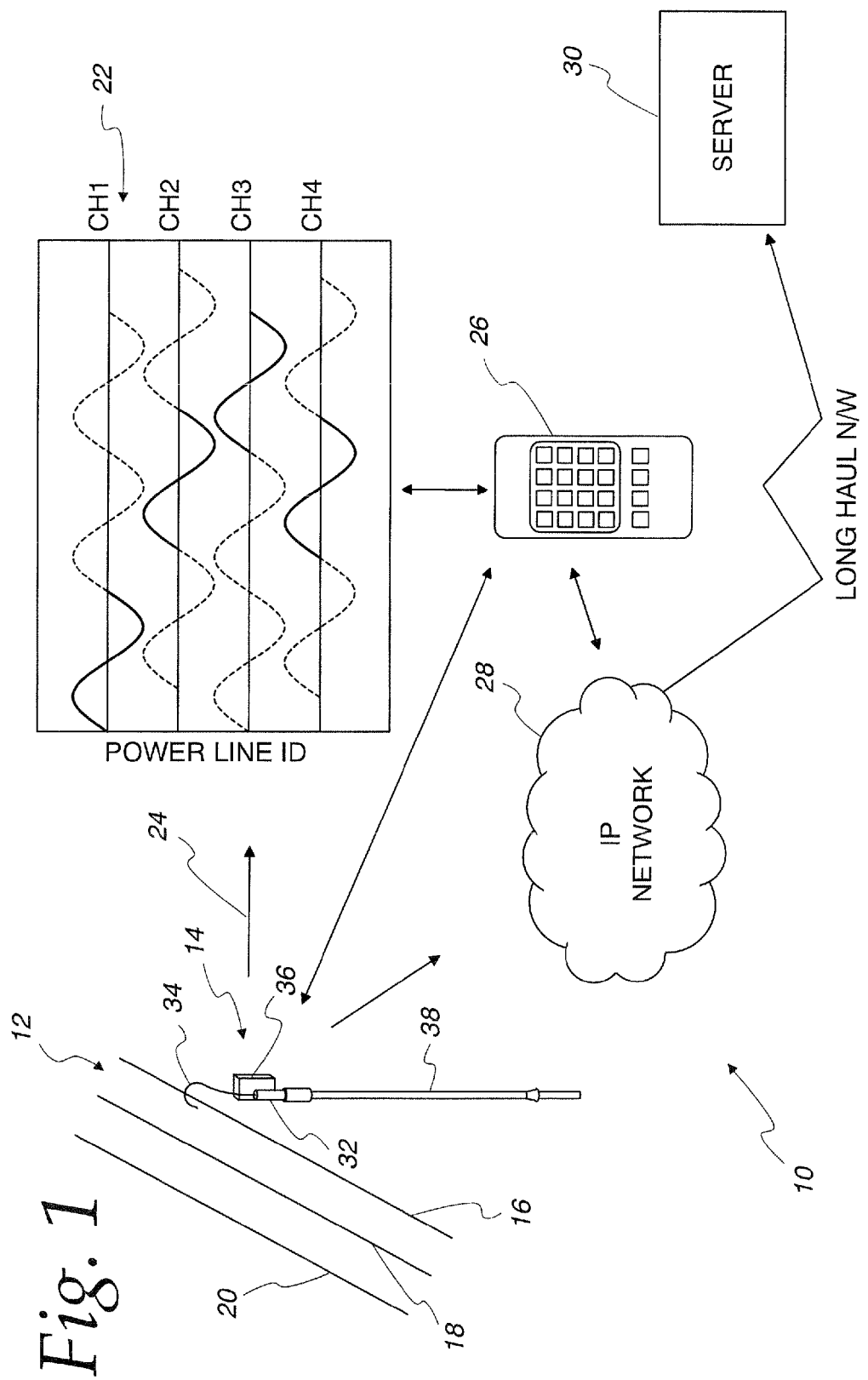
FIG. 1 is a generalized block diagram of a system for measuring phase attributes of an electrical grid system using a smart probe.

Referring initially to FIG. 1, a system 10 is used for measuring phase attributes of a high voltage transmission line system 12 using a single smart probe 14. Particularly, the system 10 is used for measuring phase-to-phase voltage and other phase attributes of the high voltage transmission line system 12. The transmission line system 12 includes three conductors 16, 18 and 20 carrying high voltage power of alternating current with each line being 120° out of phase with the other lines, as is conventional. The smart probe 14 is used as part of the system 10 for measuring phase-to-phase voltages, or the like, such as between the conductors 16 and 18.

The smart probe 14 is used for current or voltage detection, phasing, phase difference and phase sequencing. The smart probe 14 can be used for measuring overhead electrical lines 12, or underground distribution lines, or the like and other energized equipment such as a transformer secondary. The smart probe 14 is described herein in connection with measuring phase attributes of the lines 16, 18 and 20. The smart probe 14 acquires a sample AC signal from each one of the lines 16, 18 and 20 with an assigned line ID number. An operator can enable latching of the AC signal with a time tag and line ID number. The sample data, including current or voltage amplitude and zero crossings, from a specified line is stored in memory indexed with a specific address. Collection of data from all of the designated lines is continued in sequence and stored at specific addresses, Once the data is collected from all of the lines, then an operator can initiate phase computation. Signals from all of the lines are extrapolated and/or interpolated and compared for zero crossing positive edge, and phase difference between assigned lines is computed. Optionally, the phase difference, such as illustrated in the display 22, could be displayed locally on the smart probe 14, as indicated by the arrow 24, or could be displayed on a handheld unit 26 that communicates with the smart probe 14 either directly over the Smart grid compatible Zigbee protocol or through an internet protocol (IP) network 28. The handheld device 26 may comprise a PDA, a smart phone, or the like, or a proprietary handheld device having similar capabilities to a personal computer. Moreover, the information could be displayed on a server 30 connected via a long haul network through the IP network 28 to the smart probe 14, as will be apparent.

The smart probe 14 comprises a high voltage probe 32 having an electrode 34 connected thereto. The electrode 34 is used for contacting an AC line, such as the line 16. A meter housing 36 is secured to the high voltage probe 32 and includes circuitry, discussed below, for measuring the AC signal. An extension pole 38 may be attached to the high voltage probe 32 to enable an operator to reach the line being tested.

Referring to FIG. 2, a high level architecture diagram illustrates the functional components of the system 10. The blocks surrounded by the dashed outline comprise the components of the smart probe 14. This diagram illustrates the high voltage probe 32 measuring a high voltage line of the transmission line system 12.

In accordance with the invention, the high voltage probe 32 comprises a sensing element for selectively measuring current or voltage of the high voltage electrical line. Particularly, the high voltage probe 32 may comprise a high voltage resistor in series with the electrode 34 or an inductive coupling sensor, as is known. The high voltage probe 32 is connected to a probe circuit 40 for signal conditioning of the measured sinusoidal AC signal. A precision clock generator 41 which comprises a reference time clock to time tag zero crossings. A signal processing circuit 42 receives the sinusoidal AC signal from the probe circuit 40 and the precision clock signal from the clock generator 41. The signal processing circuit 42 includes a comparator circuit to convert the sinusoidal AC signal to rectangular pulses and detects zero crossing points. The reference time clock is used to time stamp the zero crossing points. A first memory 43 stores samples of the amplitude and time tagged zero crossings from the signal processing circuit 42. The stored samples are also identified with high voltage line ID number. The operator can designate the line ID number by conventional numbering or it could be entered through a user interface while a trigger button is actuated. The trigger button can be located on the smart probe 14, or could be in the handheld device 26, or both. The designation of a line ID number is not mandatory while working on only one set of lines of a three phase power system. However, the line ID number is mandatory when working on multiple lines from crossing over or parallel sets of three phase lines, as will be apparent.

The stored samples from the first memory 43 are transferred to a second memory 44. The first memory 43 is then cleared, while the second memory 44 accumulates stored samples. This allows the smart probe 14 to be used to measure voltage of other lines as noted at the second memory block 44 and indicated by a dotted line 46. Particularly, the first memory 43 is operative to temporarily store a sample for a given reading. These samples are then passed on to the second memory 44 which stores multiple samples for different readings.

After the sample data is stored, off line computation and analysis can be performed at various nodes. Any one of local display of the smart probe 14, the handheld device 26 and/or remote server 30 could be used independently or simultaneously. These functionalities may be achieved through Zigbee or Wi-Fi communication and embedded application software running at each of the respective nodes.

The handheld device 26 can have bi-directional communications with the smart probe 14. The handheld device 26 can transmit control commands to the smart probe 14. These control commands can include selection of functional mode, or operational mode, and initiate a trigger pulse to start acquiring and sampling the phase data, as well as designation of line ID number.

Once the phase information is accumulated in the internal second memory 44, phase angle computation and data transmission can be enabled in any one of three different manners. The first manner is represented by a block 48 in which raw data for the stored samples is transmitted over a wireless network to the handheld device 26 for offline processing. This wireless transmission can take any known form, such as Wi-Fi. Zigbee or using internet protocol (IP) and may use Quadrature Phase Shift Keying (QPSK) for modulation of signals. With Wi-Fi or Zigbee, the smart probe 14 can communicate directly with the handheld device 26. Otherwise, communication using internet protocol could be over a greater distance to the handheld device 26 or the server 30.

A second manner of computation is represented by a block 50 internal to the smart probe 14 in which the block 50 computes the parameters such as voltage difference and phase angle. The voltage detection, phase angle, phase sequencing, frequency computation, and other phase attributes can be computed in the smart probe 14 and transmitted to the remote handheld device 26 for storing and display. These computed parameters are then transmitted to the handheld device 26 or server 30, or the like, at a block 52. Finally, the third manner comprises a block 54 which is also part of the smart probe 14. With the block 54 built in processing computes the parameters and displays phases and voltages, as illustrated at 22 in FIG. 1, on the smart probe local meter display.

Referring to FIGS. 3 and 4, a flow diagram illustrates sequence of operation of the system 10 and, as such, illustrates a method for measuring phase attributes of high voltage electric lines. This methodology begins at a block 60 which sets the probe 14 to a power On mode. The software verifies clock functionality at a block 62 and sets a functional mode at a block 64. This functional mode can designate the type of measurement to be made. The operator sets contact with one of the high voltage lines at a block 66 and triggers sampling of high voltage line data at a block 68. As mentioned above, the triggering could be done using a button on the smart probe 14 or under the command of the handheld device 26. The measured sample is then stored with time stamp and line ID number at a block 70.

Proceeding to FIG. 4, the processing of stored data is illustrated using data from the block 70, which has accumulated in the second memory 44, see FIG. 2. A block 72 selects a pair of lines to be compared. The stored data for the corresponding selected lines is retrieved at a block 74. How the flow then proceeds depends on the configuration of the system. If the smart probe 14 is permanently hooked onto a gridline, then the data is transmitted by wireless communication at a block 76 and then uploaded to a remote server at a block 78. If the smart probe 14, is used by a field observer, in a manual mode, then the phase attributes are computed at a block 80 and displayed at a block 82. If remote monitoring is to be used, then the computed phase attributes are transmitted at a block 84 for remote display in the handheld unit 26, or the server 30, at a block 86.

The phase computation algorithm used in the system 10 is as follows. The user samples the first line 16 with the smart probe 14. The data is logged with a time stamp. The user then likewise samples the second 18 and then the third line 20 also with the single smart probe 14. This data is also logged with a time stamp. The time stamped data is analyzed to determine the relative phase and voltage using the following equations.

$Y1(t) = A1\ \mathrm{Sin}(wt1 + \varnothing 1)$ $Y2(t) = A1\ \mathrm{Sin}(wt2 + \varnothing 2)$ $V1 = \mathrm{MAX}(Y1(t))$ $V2 = \mathrm{MAX}(Y2(t))$ $\varnothing 1 - \varnothing 2 = \mathrm{SinInv}(Y1(t)/A1) - \mathrm{SinInv}(Y2(t)/A2) - w(t1 - t2)$ The described phase measurement scheme using the smart probe 14 is illustrated graphically in FIG. 5. Initially, the smart probe 14 is used to measure the line 1 conductor 16. As indicated, the zero crossings occur at times T10, T11, T12 and T13, see 90. Next, the smart probe 14 is used to measure the line 2 second conductor 18. The zero crossings thereof occur at times T20, T21, T22 and T23, see 92. To compute the phase parameters, the system 10 interpolates a representation of line 1 on line 2, as illustrated at curve 94, using the time tagged zero crossings at 90. The relative phase measurement can then be represented at curve 96 which combines the curves for Lines 1 and 2 and produces the phase measurement data.

As described, the system 10 uses a single high voltage probe 14 comprising a sensing element 32 for selectively measuring current or voltage of a high voltage electrical line 16, 18 or 20 and developing a measured signal. A processing circuit 40 detects zero crossings of the measured signal and applies a time tag to the zero crossings and stores samples of the measured signal and time tagged zero crossings in a first memory 43. A second memory 44 stores samples of the measured signal and time tagged zero crossings for a plurality of high voltage electrical lines. Each of the smart probe 14, handheld device 26 and server 32 includes processing capability for determining phase relationships between the plurality of high voltage electrical lines using the data stored in the second memory 44.

The described single probe concept for phase sequencing utilizes an autonomous probe independent of GPS. It is also independent of a remote reference or reference probe. The clock stabilizes with no loss of operator's time. The single probe provides the functionality enabling determination of phase detection, voltage detection, phase difference computation and phase sequencing to be performed by grid maintenance personnel.

The system allows for display and control on a local handheld device using a wireless interface with the handheld device providing for selection of functional modes, device control and display. The handheld device makes the operations easy and overcomes issues due to readability and data storage. This improves the speed and efficiency of operation by providing real time inferences and making operation easy.

Remote data transfer and storage is provided by availability of data in the handheld which enables transmission of phase attributes to a remote server or substation. The logging of digital data enables real time and post maintenance analysis by a troubleshooting team. The availability of phase attributes of every grid being monitored enables analysis of fault history, estimation of load parameters and trend analysis which in turn enables planning of preventive maintenance schedules and load distribution.

The smart probe could be fixed to grid lines by anchoring with insulated hooks and the wireless module could transmit the data on an event basis or time basis logic to a substation. The location coordinate data updated during installation could also ensure grid mapping and grid monitoring in real time on a continuous basis. The elimination of GPS receivers, reference probes and advance design concepts ensures a low cost solution to utility industries.

It will be appreciated by those skilled in the art that there are many possible modifications to be made to the specific forms of the features and components of the disclosed embodiments while keeping within the spirit of the concepts disclosed herein. Accordingly, no limitations to the specific forms of the embodiments disclosed herein should be read into the claims unless expressly recited in the claims. Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

The present invention has been described with respect to flowcharts and block diagrams. It will be understood that each block of the flowchart and block diagrams can be implemented by computer program instructions. These program instructions may be provided to a processor to produce a machine, such that the instructions which execute on the processor create means for implementing the functions specified in the blocks. The computer program instructions may be executed by a processor to cause a series of operational steps to be performed by the processor to produce a computer implemented process such that the instructions which execute on the processor provide steps for implementing the functions specified in the blocks. Accordingly, the illustrations support combinations of means for performing a specified function and combinations of steps for performing the specified functions. It will also be understood that each block and combination of blocks can be implemented by special purpose hardware-based systems which perform the specified functions or steps, or combinations of special purpose hardware and computer instructions.

The invention claimed is:

1. A system for measuring phase attributes of high voltage electrical lines comprising:
    a single high voltage probe comprising a sensing element for selectively measuring current or voltage of a high voltage electrical line and developing a measured signal, and a processing circuit for detecting zero crossings of the measured signal, applying a time tag to the zero crossings, and storing samples of the measured signal and time tagged zero crossings;
    a memory for storing samples of the measured signal, by said single high voltage probe, and time tagged zero crossings for each of a plurality of high voltage electrical lines; and
    a processor operatively associated with the memory for determining phase relationships between the plurality of high voltage electrical lines.

2. The system for measuring phase attributes of high voltage electrical lines of claim 1 wherein the probe comprises a housing and the processing circuit, the memory and the processor are enclosed in the housing.

3. The system for measuring phase attributes of high voltage electrical lines of claim 2 wherein the probe further comprises a display for displaying the phase relationships.

4. The system for measuring phase attributes of high voltage electrical lines of claim 2 further comprising a remote device wirelessly communicating with the probe and the remote device comprises a display for displaying the phase relationships.

5. The system for measuring phase attributes of high voltage electrical lines of claim 1 comprising a remote device for wirelessly communicating with the single probe and including the memory and the processor.

6. The system for measuring phase attributes of high voltage electrical lines of claim 5 wherein the remote device further comprises a display for displaying the phase relationships.

7. A system for measuring phase attributes of high voltage electrical lines comprising:
    a smart probe comprising a housing supporting a sensing element, a probe circuit in the housing and coupled to the sensing element for selectively measuring current or voltage of a high voltage electrical line and developing a measured signal, a reference time clock, a processing circuit for detecting zero crossings of the measured signal and applying a time tag from the time clock to the zero crossings, and a first memory for storing samples of the measured signal and time tagged zero crossings;
    a second memory operatively associated with the first memory for storing samples of the measured signal, by said smart probe, and time tagged zero crossings for each of a plurality of high voltage electrical lines; and
    a processor operatively associated with the second memory for determining phase relationships between the plurality of high voltage electrical lines.

8. The system for measuring phase attributes of high voltage electrical lines of claim 7 wherein the second memory and the processor are enclosed in the housing.

9. The system for measuring phase attributes of high voltage electrical lines of claim 8 wherein the smart probe further comprises a display for displaying the phase relationships.

10. The system for measuring phase attributes of high voltage electrical lines of claim 8 further comprising a remote device wirelessly communicating with the smart probe and the remote device comprises a display for displaying the phase relationships.

11. The system for measuring phase attributes of high voltage electrical lines of claim 7 comprising a remote device for wirelessly communicating with the smart probe and including the second memory and the processor.

12. The system for measuring phase attributes of high voltage electrical lines of claim 11 wherein the remote device further comprises a display for displaying the phase relationships.

13. A method for measuring phase attributes of high voltage electrical lines comprising:
    providing a single high voltage probe comprising a sensing element for selectively measuring current or voltage of a high voltage electrical line and developing a measured signal, and a processing circuit for detecting zero crossings of the measured signal, applying a time tag to the zero crossings, and storing samples of the measured signal and time tagged zero crossings;
    operating the probe to sequentially store samples of the measured signal and time tagged zero crossings for a plurality of high voltage electrical lines; and
    determining phase relationships between the plurality of high voltage electrical lines using the sequentially stored samples.

14. The method for measuring phase attributes of high voltage electrical lines of claim 13 wherein the operating and determining steps are performed in the probe.

15. The method for measuring phase attributes of high voltage electrical lines of claim 14 further comprising displaying the phase relationships at the probe.

16. The method for measuring phase attributes of high voltage electrical lines of claim 14 further comprising the probe wirelessly communicating with a remote device for displaying the phase relationships.

17. The method for measuring phase attributes of high voltage electrical lines of claim 13 comprising the probe wirelessly communicating with a remote device and the remote device performing the operating and determining steps.

18. The method for measuring phase attributes of high voltage electrical lines of claim 17 further comprising displaying the phase relationships at the remote device.

* * * * *